United States Patent [19]

Whiteman, Jr.

[11] 4,252,392
[45] Feb. 24, 1981

[54] ZERO INSERTION FORCE CONNECTOR CLIP

[75] Inventor: Robert N. Whiteman, Jr., Middletown, Pa.

[73] Assignee: AMP Incorporated, Harrisburg, Pa.

[21] Appl. No.: 73,402

[22] Filed: Sep. 7, 1979

[51] Int. Cl.³ .................. H01R 13/62; H05K 1/12
[52] U.S. Cl. ..................... 339/74 R; 339/176 MF
[58] Field of Search .......... 339/17 F, 75 MP, 74 R, 339/176 MF

[56] References Cited

U.S. PATENT DOCUMENTS

| 3,537,063 | 10/1970 | Beauliev | 339/74 R |
| 4,172,626 | 10/1979 | Olsson | 339/17 F |
| 4,181,386 | 1/1980 | Olsson | 339/17 F |

Primary Examiner—Neil Abrams
Attorney, Agent, or Firm—Frederick W. Raring

[57] ABSTRACT

A zero insertion force (ZIF) connector clip for connecting parallel spaced-apart cable conductors in a flat cable to parallel spaced-apart circuit board conductors comprises a clip bar having flanges extending from its ends which support the clip bar in spaced relationship to the circuit board conductors. Cantilever springs extend from one edge of the clip bar, each spring having a reversely bent portion, a spring arm portion, an arcuate bend, and a free end which is between the flanges. The arcuate bent portions of the springs bear against the circuit board conductors. A spring unloading means is provided on the clip and has a spring lifting portion which extends between the flanges and is supported in vertical slots in the flanges. This unloading portion is located between the surface of the circuit board and the free ends of the springs so that when it is moved relatively away from the circuit board, the springs are lifted away from the circuit board and the cable can be inserted between the springs and the circuit board under zero insertion force conditions. The spring unloading portion has an integral handle located externally of, and beside one, of the flanges by means of which it can be lifted.

5 Claims, 10 Drawing Figures

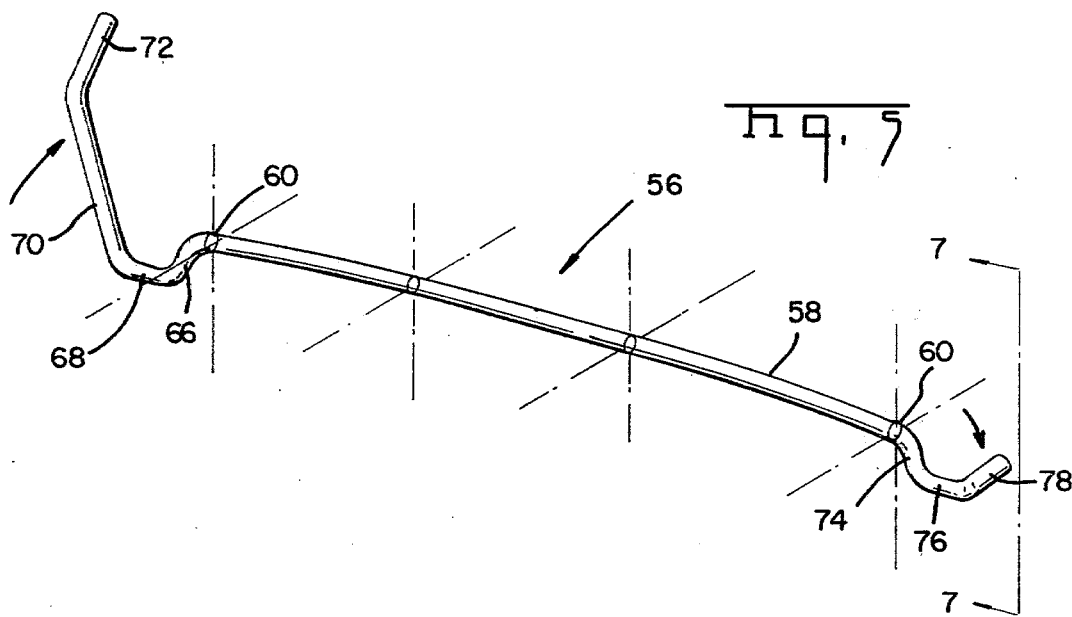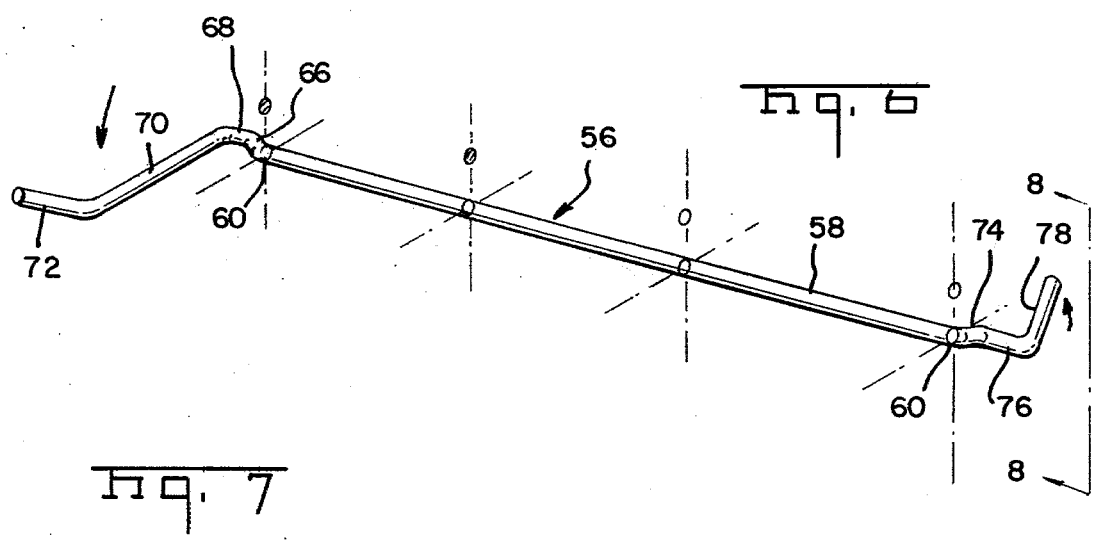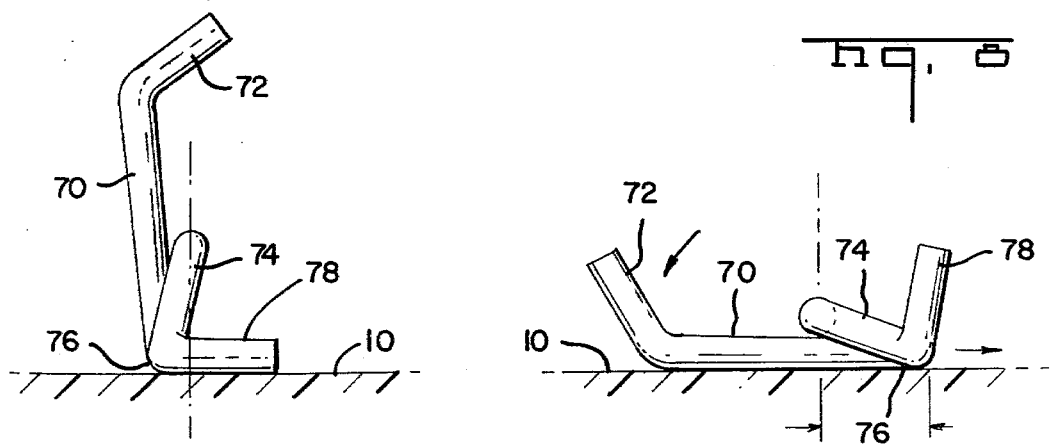

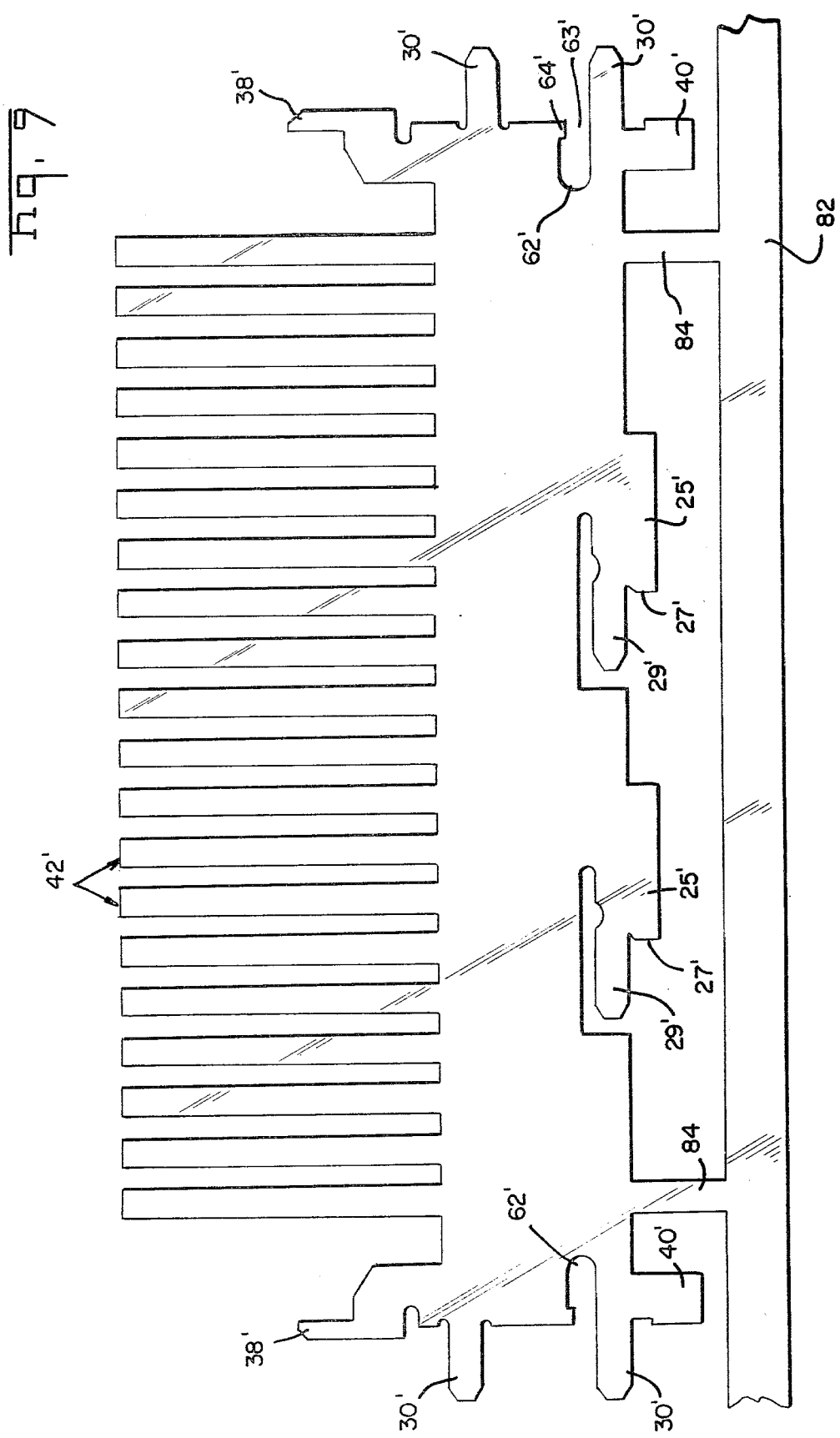

ZERO INSERTION FORCE CONNECTOR CLIP

FIELD OF THE INVENTION

This invention relates to electrical connecting devices of the type which are mounted on a circuit board in straddling relationship to spaced-apart circuit board conductors and which have springs for pressing a cable, located between the springs and the circuit board conductors, against the circuit board so that the cable conductors are placed in electrical contact with the circuit board conductors.

BACKGROUND OF THE INVENTION

U.S. Application Ser. No. 953,677 filed Oct. 23, 1978 (now U.S. Pat. No. 4,181,386) discloses and claims a connector clip comprising a one-piece stamped and formed member of spring material, such as spring steel, which is adapted to be mounted on a circuit board in straddling relationship to parallel spaced-apart circuit board conductors. The connecting connector clip has integral cantilever springs which bear against the circuit board and which serve to press the cable against the circuit board so that the cable conductors are resiliently urged against the circuit board conductors. The connector clip does not, therefore, serve an electrical function but merely a mechanical function of pressing the cable conductors against the circuit board conductors.

The above identified application discloses and teaches the use of a separate spring unloading tool which can be used to raise the spring members away from the circuit board so that the cable can be inserted between the circuit board and the spring members under zero insertion force (ZIF) conditions. It has been found that connector clips of this type often require ZIF features for the reason that the forces exerted by the springs are quite high and it is difficult to insert the cable between the springs and the circuit board when the springs are resiliently biased against the circuit board. Application Ser. No. 24,356 filed Mar. 27, 1979, shows another form of zero insertion force connector clip in which an integral lifting member is provided on the ends of the springs.

The present invention is directed at the achievement of an improved ZIF connector clip in which the spring lifting means is assembled to and remains part of the connector clip. The invention is further directed to the achievement of a connector clip which can be produced with a relatively long span so that it can be used for cables and connecting conductors of high count cables (cables having more than ten conductors) to equal numbers of circuit board conductors. It has been found that there is a limit to the number of cable conductors which can be connected to circuit board conductors when connector clips of the type disclosed in the above identified applications are used. The connector clip must straddle all of the circuit board conductors when it is assembled to the circuit board and the stresses imposed on the connector clip by the spring members will become relatively high if the clip is such that it must span a wide array of side-by-side circuit board conductors.

A connector clip in accordance with the present invention comprises a clip bar having flanges extending from its ends and means on the flanges for mounting the clip on a circuit board with the clip bar extending transversely of the circuit board conductors. A plurality of cantilever springs extend from one edge of the clip bar and each spring is reversely bent adjacent to the clip bar thereby to provide a spring arm portion extending obliquely towards the circuit board. Each spring has an arcuate bend which forms a contact portion, which bears against the circuit board, and a free end which extends from the contact portion and is between the flanges of the clip bar. The spring lifting member is mounted in the flanges and has an intermediate lifting portion which extends transversely past the free ends of the spring members and is between the spring members and the surface of the circuit board. This lifting member is supported in slots in the flanges which permit its movement away from the surface of the circuit board and towards the clip bar. Upon such movement of the lifting member, the free ends of the springs are raised from the surface of the circuit board and the contact portions of the springs are also moved away from the surface of the circuit board so that a cable can be inserted between the springs and the circuit board under ZIF conditions. Camming and handle means are provided on the lifting member externally of the flanges to permit lifting of the springs as described above.

DESCRIPTION OF THE DRAWINGS

FIGS. 5 and 6 are perspective views of the formed wire spring lifting member, FIG. 5, showing the position of this part when the springs are unloaded or raised from the surface of the circuit board, and FIG. 6 showing the position of this part when the springs are in their lowered condition.

FIGS. 7 and 8 are views looking in the direction of the arrows 7—7 and 8—8 of FIGS. 5 and 6 respectively.

FIG. 9 is a plan view of the flat blank from which the connector clip is formed.

PRACTICE OF THE INVENTION

Figure 1:
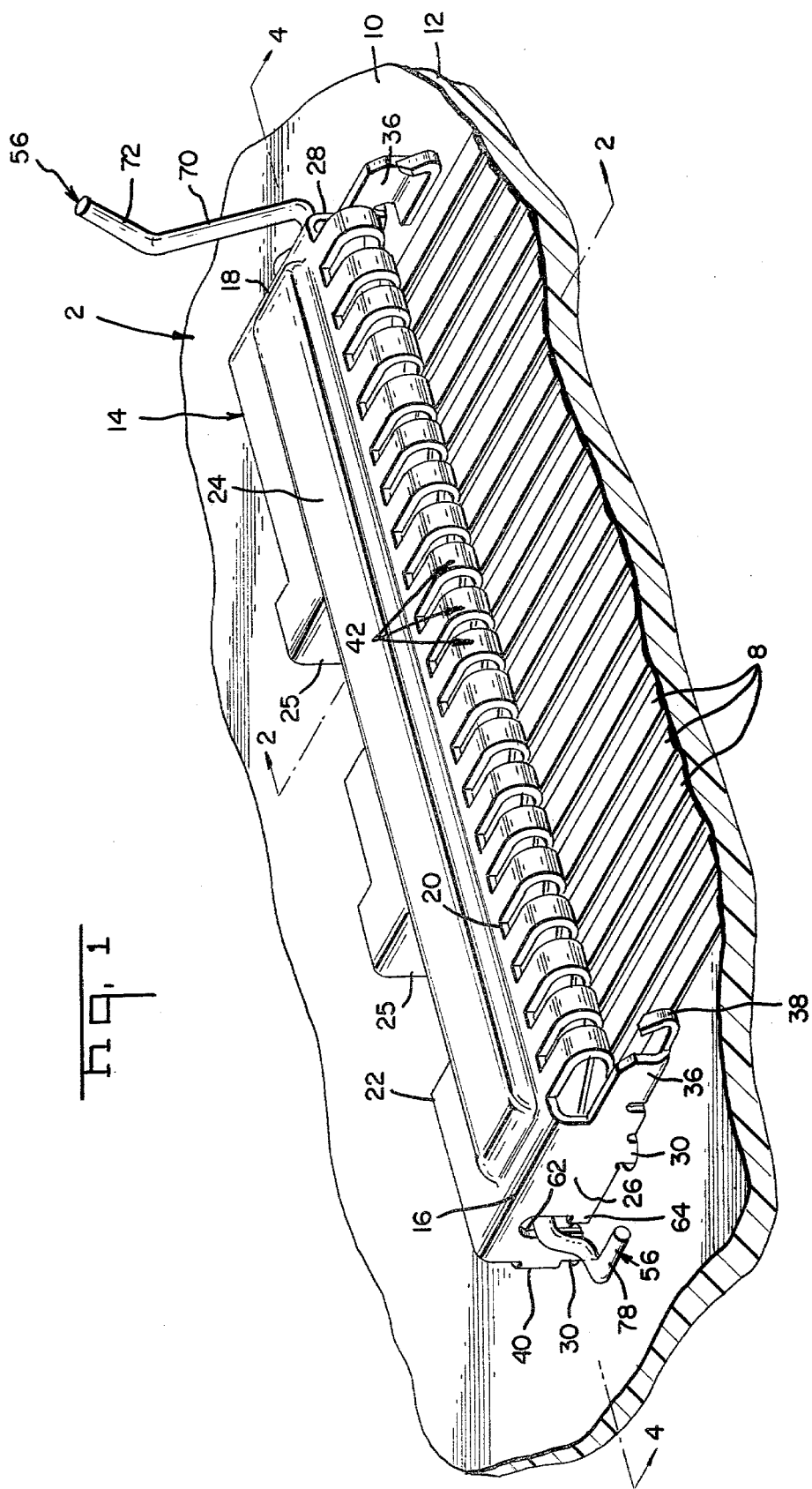
FIG. 1 is a perspective view showing a zero insertion force (ZIF) connector clip mounted on one surface of a circuit board, this view showing the positions of the parts when the ends of the springs are raised from the surface of the circuit board to permit insertion of a cable under ZIF onditions.
Figure 2:
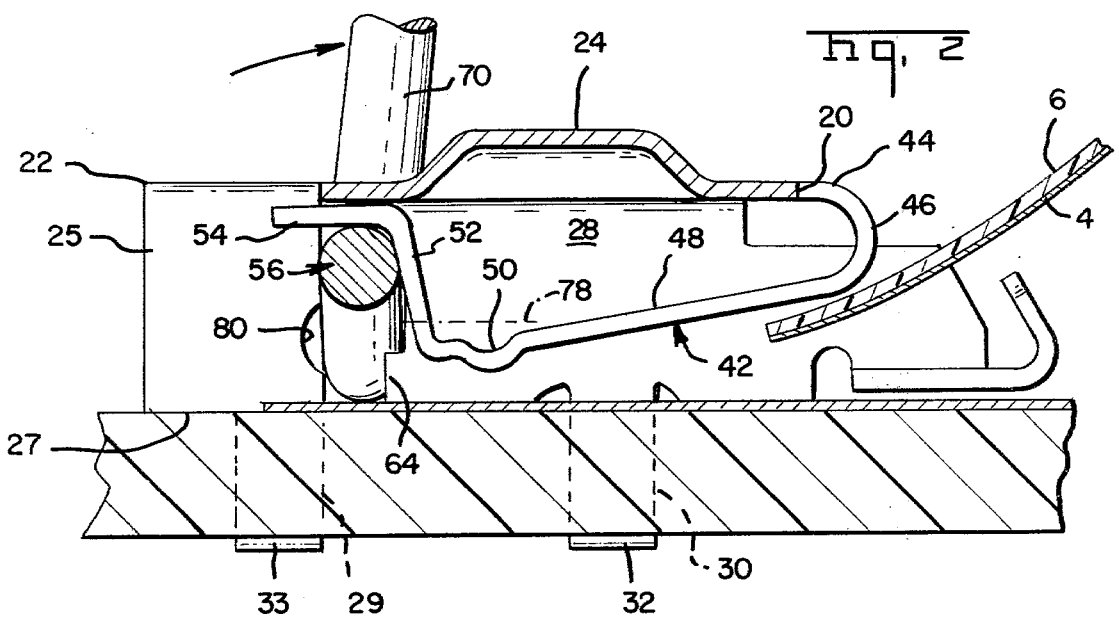
FIG. 2 is a view taken along the lines 2—2 of FIG. 1.
Figure 3:
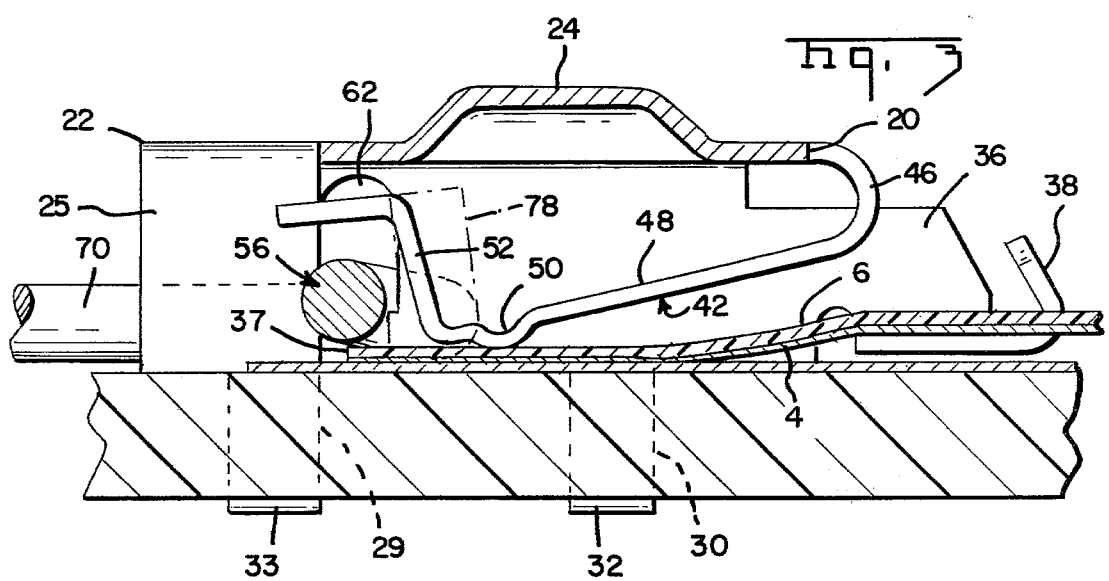
FIG. 3 is a view similar to FIG. 2 but showing the positions of the parts after the cable has been inserted and the springs released so that they bear against the surface of the cable.
Figure 4:
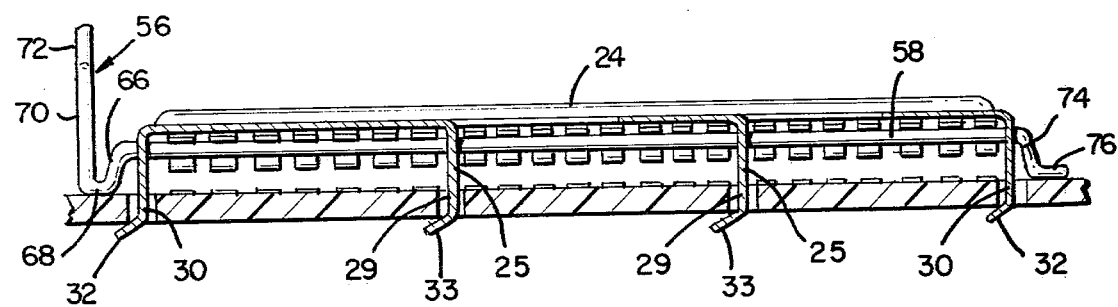
FIG. 4 is a view taken along the lines 4—4 of FIG. 1.

Referring first to FIGS. 1-3, a connector clip 2 in accordance with the invention, serves to connect the spaced-apart cable conductors 4 on the underside of cable 6 to an equal number of parallel spaced-apart circuit board conductors 8 on the upper surface 10 of a circuit board 12. As illustrated in FIGS. 2 and 3, and, as will become apparent from the following description, the cable 6 can be inserted into the connector clip with the cable conductors 4 aligned with the circuit board conductors 8 under ZIF conditions.

In the description which follows, unprimed reference numerals are used to identify the parts of the formed clip 2 as shown in FIGS. 1-4. The clip is formed from the flat blank shown in FIG. 9 and primed reference numerals are used in FIG. 9 to identify those parts of the blank which become the like numbered parts of the finished member shown in FIG. 1. The blanks are advantageously produced as a continuous strip with each blank connected to a carrier strip 82 by connecting sections 84 which are removed when the connector is produced in the forming die.

The clip 2 is a one-piece stamped and formed metal of a material, such as steel since it need not be highly conductive, and comprises a rectangular clip bar 14 having ends 16, 18 and first and second side edges 20, 22 extending between the ends. The clip bar 14 may be embossed, as shown at 24, to improve its stiffness, for the reason that this member is highly stressed when the clip is in use.

Figure 10:
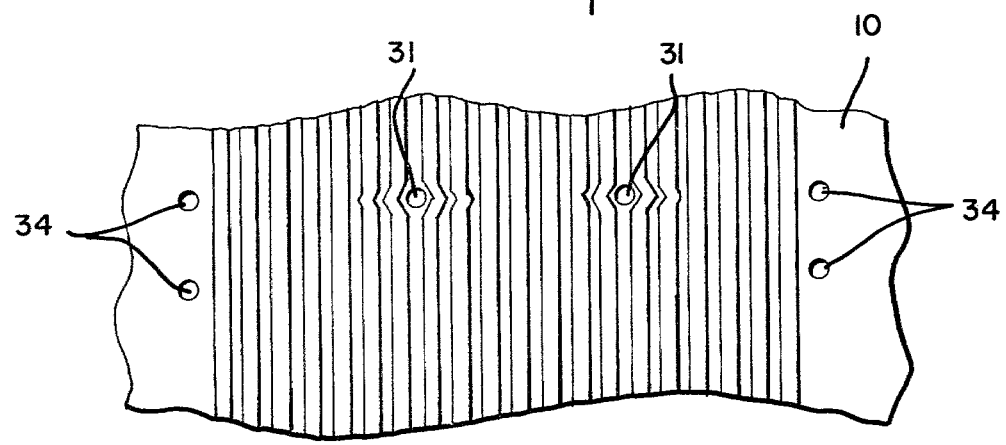
FIG. 10 is a plan view of the surface of a circuit board having conductors thereon and holes in the circuit board for receiving the mounting ears of the connector clip.

Flanges 26, 28 extend normally from the ends 16, 18 and are adapted to bear against the surface of the board 10 as shown in FIG. 1. Each flange has mounting ears 30 extending from its lower edge, which are received in openings 34 (FIG. 10) in the circuit board and which are clinched, as shown at 32, against the underside of the circuit board.

The clip bar is also supported by support columns 25 which are formed from portions of the clip bar adjacent to the second side edge 22. Each of these support columns has a lower edge 27 which bears against the surface of the circuit board and a mounting ear 29 which extends through a hole 31 when the clip is mounted on the circuit board. The mounting ears are also clinched as shown at 33.

The flanges 26, 28 have rightwardly, as viewed in FIGS. 1 and 2, extending portions 36 on the ends on which there are provided upstanding ears 38 which are received in punched holes in the cable 6 adjacent to its side edges. The interengagement of these ears 38 with the cable provide a strain relief to some extent for the cable and also serves to locate the cable so that its end 37 will be disposed beneath the contact portions of the springs 42 described below. Additionally, inwardly directed ears which serve as stops 40 may be provided on the left hand edges of the flanges 26, 28, as viewed in FIGS. 1 and 2, although these ears may not be used under all the circumstances.

The cantilever springs 42 which serve to press the cable conductors 4 against the circuit board conductors 8 extend from the first side edge 20 of the clip bar and are in alignment with the circuit board conductors as best shown in FIG. 1. Each spring 42 has a fixed end 44, a reverse bend 46 adjacent to its fixed end and a spring arm portion 48 which extends from the reverse bend obliquely downwardly. Each spring has an arcuate bend 50 at the end of arm 48 which is formed to provide a bearing area. An upwardly projecting portion 52 extends from the arcuate bend 50 and this upwardly extending portion merges with a free end portion 54 which is substantially horizontal and slightly downwardly inclined, as shown in FIG. 3. The normal conditions of the springs 42 are shown in FIG. 3, in which they are biased against the circuit board and in order to insert the cable 6 under ZIF conditions, it is necessary to lift all of the springs by means of the lifting member 56 which will now be described.

The lifting member is a formed stiff wire having an intermediate spring lifting portion 58 which is slightly bowed and which merges at its ends 60 with obliquely extending sections 66, 74. These obliquely extending sections in turn merge with straight sections 68, 76 which in turn merge with laterally extending arms 70, 78. The arm 70 is bent at its end 72 and is relatively long, as compared with the arm 78.

The ends 60 of the intermediate lifting portion 58 are supported in vertically extending slots 62 in the flanges 26, 28 so that the intermediate portion can be raised and lowered within the limits illustrated in FIGS. 2 and 3. Each of the slots 62 has an inwardly extending ear 64 at its lower end adjacent to the circuit board so that the lowermost position of the lifting member is defined by these ears and the intermediate portion 58 will therefore be maintained above the surface 10 of the circuit board. The lifting member is assembled to the clip 2 prior to mounting of the clip on the circuit board and the portions 60 of the lifting member can be moved past the constricted entrance (shown at 63' in FIG. 9) and into the slots 62 by virtue of the fact that the adjacent mounting legs or ears 30 are capable of limited flexure. After the lifting member 56 has been assembled to the clip 2, the mounting ears 30 will return to their normal positions and the lifting member will remain captured on the clip. After the clip is mounted on the circuit board and the mounting ears 30 are clinched to the board as shown in FIG. 3 at 33, these ears will not be capable of flexure and the lifting member will be permanently captured.

In use, when the springs 42 are in their lowered positions (FIG. 3) the arm portion 70 of the lifting member 56 will lie against the surface 10 of the circuit board and the end 72 of the arm will extend obliquely away from the circuit board as shown in FIG. 8. The intermediate portion 58 of the lifting member will be in its lowermost position and will be supported in notches 80 in the edges of the supporting columns 25. The obliquely extending sections 66, 74 will extend from the external surfaces of the flanges 26, 28 to the surface of the circuit board and the straight sections 68, 76 will lie on the surface of the circuit board. The short arm 78 will extend obliquely upwardly from the surface of the circuit board, as also shown in FIG. 8. The intermediate portion will be disposed between the surface 10 of the circuit board and the free end portions 54 of the springs 42. When it is desired to lift the springs from the surface of the circuit board to withdraw or to insert a cable 6, the end 72 of the arm 70 grasped and swung upwardly from the position of FIG. 8 to the position of FIG. 7. This upward movement of the arm 70 will cause the entire lifting member to rotate about the axis extending through the ends 60 of the intermediate portion 58 of the lifting member. Rotation of the arm 70 will also cause the straight sections 68, 76 to slide across the surface of the circuit board. This sliding movement of the straight sections in turn causes the oblique sections 66, 74 to move arcuately upwardly until they are slightly over-center with reference to a plane which extends normally of the plane of the circuit board. As a result, the intermediate lifting portion 58 is raised upwardly along a path defined by the slots 62 and thereby pushes the free end portions 54 of the springs upwardly to raise the contact portions 50. The cable 6 can then be inserted or withdrawn.

As shown in FIG. 7, the arm 78 is against the surface of the circuit board 10 when the arm 70 is in its upstanding position and the arm 78 therefore serves as a stop, limiting further movement of the arm 70 beyond the position of FIG. 7. When the parts are in the position of FIG. 8, the arm 70 acts as a stop since this arm is against the surface 10. It should also be mentioned that when the parts are in the positions of FIGS. 2, 5, and 7, the intermediate portion 58 is slightly over-center and the downward force exerted on this intermediate portion by the free ends 54 of the springs cannot cause the lifting member to return to the position of FIG. 3.

As indicated in the drawing and as previously mentioned, the intermediate portion 58 of the lifting member is bowed somewhat so that a line drawn between the centers of the ends 60 of the intermediate portions would define a chord. This bowed shape is desirable, particularly if the lifting is relatively long, since the force exerted on the lifting member by the springs 42 when the lifting member is in the position of FIG. 2 tends to straighten the intermediate section of the lifting member. In other words, the bowed configuration of this lifting member permits the use of a relatively smaller diameter wire for this lifting member than would otherwise be required.

I claim:

1. An electrical connector clip for connecting the spaced-apart cable conductors in a flat conductor cable to circuit board conductors on a circuit board, said conductor clip comprising a generally rectangular clip bar having first and second side edges and a flange extending from each end thereof, a plurality of cantilever springs extending from said first side edge, each of said springs having a reverse bend adjacent to said first side edge and having a spring arm which extends from said bend past said first side edge, said spring arms being between said flanges and having pressure applying portions, said spring arms having free ends which are between said flanges, the improvement to said connector clip comprising:

spring unloading means comprising a stiff wire extending between, and rotatably supported in, said flanges, said wire having ends which extend through, and beyond, said flanges, an integral handle on one of said ends of said wire for rotating said wire about an axis which extends between said flanges, an intermediate spring lifting portion of said wire being eccentric with respect to said axis, said free ends of said springs being between said clip bar and said intermediate portion of said wire whereby, upon mounting said connector clip on said circuit board, said pressure applying portions of said spring arms will bear against said circuit board conductors, and upon rotation of said wire with respect to said axis by manipulation of said handle, said intermediate portions of said wire will move along an arcuate path towards said clip bar and flex said spring arms towards said clip bar whereby said flat cable can be placed between said spring arms and said circuit board.

2. An electrical connector clip as set forth in claim 1, said wire having an integral stop on the other end thereof for limiting rotational movement of said wire with respect to said axis.

3. A connector clip as set forth in claim 2, having mounting means for mounting said clip on a circuit board, said mounting means comprising integral ears extending from said flanges.

4. A connector clip as set forth in claim 3 having supporting columns integral with, and extending from said clip bar, said supporting columns being spaced from said flanges and serving to support intermediate portions of said clip when said clip is mounted on a circuit board.

5. A connector clip as set forth in claim 1, said stiff wire having camming means on at least one of said ends, said camming means being movable across surface portions of a printed circuit board thereby to cam said springs away from said circuit board.

* * * * *